(12) United States Patent  (10) Patent No.: US 8,976,523 B2
Song et al.  (45) Date of Patent: Mar. 10, 2015

(54) MOBILE TERMINAL

(71) Applicant: LG Electronics Inc., Seoul (KR)

(72) Inventors: Insu Song, Seoul (KR); Minchul Shin, Gunpo (KR); Youngmin Lee, Seoul (KR); Younghwan Moon, Gwangmyeong (KR)

(73) Assignee: LG Electronics Inc., Seoul (KR)

( * ) Notice: Subject to any disclaimer, the term of this patent is extended or adjusted under 35 U.S.C. 154(b) by 132 days.

(21) Appl. No.: 13/735,563

(22) Filed: Jan. 7, 2013

(65) Prior Publication Data

US 2013/0242478 A1     Sep. 19, 2013

(30) Foreign Application Priority Data

Mar. 14, 2012 (KR) ........................ 10-2012-0026311

(51) Int. Cl.
*H05K 5/00* (2006.01)
*H05K 7/00* (2006.01)
*G06F 1/16* (2006.01)
*H05K 5/02* (2006.01)
*H04M 1/02* (2006.01)

(52) U.S. Cl.
CPC ........... *H05K 5/0239* (2013.01); *H04M 1/0202* (2013.01)
USPC .................. 361/679.56; 361/679.3; 455/575.1

(58) Field of Classification Search
USPC .......... 361/679.3, 679.55, 679.56; 455/575.1, 455/575.9
See application file for complete search history.

(56) References Cited

U.S. PATENT DOCUMENTS

| 6,148,183 A * | 11/2000 | Higdon et al. ............. 455/575.1 |
| 6,652,297 B1 * | 11/2003 | Zhang et al. .................. 439/136 |
| 7,539,008 B2 * | 5/2009 | Chang et al. ............... 361/679.4 |
| 7,787,243 B2 * | 8/2010 | Salazar et al. ........... 361/679.31 |
| 7,837,484 B2 * | 11/2010 | Wu ............................... 439/136 |
| 7,889,493 B2 * | 2/2011 | Lee ........................... 361/679.4 |
| 7,907,982 B2 * | 3/2011 | Juan et al. .................. 455/575.4 |
| 2006/0154520 A1 * | 7/2006 | Gennai et al. ................. 439/578 |

FOREIGN PATENT DOCUMENTS

| JP | 5-77978 U | 10/1993 |
| JP | 2002-041185 A | 2/2002 |
| JP | 2004-047840 A | 2/2004 |
| JP | 2005-072545 A | 3/2005 |
| JP | 2008-108427 A | 5/2008 |
| JP | 2012-022117 A | 2/2012 |
| JP | 2012-029291 A | 2/2012 |

* cited by examiner

*Primary Examiner* — Anthony Haughton
(74) *Attorney, Agent, or Firm* — Birch, Stewart, Kolasch & Birch, LLP

(57) ABSTRACT

A mobile terminal includes: a body having a slot at one side thereof; a socket mounted to the body, and to which an external device is connected through the slot; a slide door coupled to the body so as to expose or cover the socket; and a guide portion formed in the body, and configured to guide motion of the sliding door, wherein the slide door comprises: a base having a plate shape; a manipulation portion protruding from a front surface of the base, and exposed to the outside through the slot; and a rail portion formed to be slidable along the guide portion, and coupled to a rear surface of the base so as to be covered by the base.

21 Claims, 8 Drawing Sheets

MOBILE TERMINAL

CROSS-REFERENCE TO RELATED APPLICATION

Pursuant to 35 U.S.C. §119(a), this application claims the benefit of earlier filing date and right of priority to Korean Application No. 10-2012-0026311, filed on Mar. 14, 2012, the contents of which is incorporated by reference herein in its entirety.

BACKGROUND OF THE INVENTION

1. Field of the Invention

The present disclosure relates to a mobile terminal, and particularly, to a mobile terminal having a socket to which an external device is connectable.

2. Background of the Invention

Recently, as functions of a mobile terminal become more diversified, the mobile terminal may be embodied in the form of a multimedia player or a device, having various functions such as capturing a still image or a moving image, playing music or a moving image file, and receiving broadcast.

Various attempts have been made to implement complicated functions in such a multimedia device by means of hardware or software. As one example, the mobile terminal is provided with a data port for transceiving (transmitting and receiving) data with an external device. The mobile terminal may be provided with a power port for receiving power from the outside.

Such socket is directly exposed to the outside, or is exposed to the outside through manipulation in a state of being covered by an additional member. In the latter case, especially if a slide door is slid to cover or expose the socket, a rail structure for operating and fixing the slide door is complicated. Further, such structure makes it difficult to implement a slim configuration of the mobile terminal.

SUMMARY OF THE INVENTION

Therefore, an aspect of the detailed description is to provide a mobile terminal having a structure to open and close a socket by a slide door, the structure differentiated from that of the conventional art.

Another aspect of the detailed description is to provide a mobile terminal having a slim configuration through a simplified structure.

To achieve these and other advantages and in accordance with the purpose of this specification, as embodied and broadly described herein, there is provided a mobile terminal, comprising: a body having a slot at one side thereof; a socket mounted to the body, and to which an external device is connected through the slot; a slide door coupled to the body so as to expose or cover the socket; and a guide portion formed in the body, and configured to guide motion of the sliding door, wherein the slide door comprises: a base having a plate shape; a manipulation portion protruding from a front surface of the base, and exposed to the outside through the slot; and a rail portion formed to be slidable along the guide portion, and coupled to a rear surface of the base so as to be covered by the base.

According to an embodiment of the present invention, the rail portion may include rails bending from two side ends of the base, and covering at least part of the guide portion.

According to an embodiment of the present invention, a stopper may be formed between the rails, and the stopper may be bent towards a groove of the guide portion, from one side of the rail portion.

According to an embodiment of the present invention, the guide portion may include a first groove coupled to the stopper in a state where the slide door has covered the socket, and a second groove coupled to the stopper in a state where the slide door has exposed the socket.

According to an embodiment of the present invention, the mobile terminal may further comprise a case configured to form the appearance of the body, and the slot may be formed at the case.

According to an embodiment of the present invention, the slide door may further comprise a manipulation portion protruding from a front surface of the base in a cylindrical shape.

According to an embodiment of the present invention, a plurality of concentric patterns concaved as a plurality of circular grooves may be formed on a front surface of the manipulation portion.

According to an embodiment of the present invention, the mobile terminal may further comprise a pressing manipulation portion protruding from one surface of the case at a position spaced from the slot. The pressing manipulation portion may be formed in a cylindrical shape, and a plurality of concentric patterns concaved as a plurality of circular grooves may be formed on one surface of the pressing manipulation portion, the surface exposed to the outside.

According to an embodiment of the present invention, the manipulation portion may be formed to slide the slide door, and the pressing manipulation portion may be formed to receive a push input such that one of functions preset to the body is executed.

According to an embodiment of the present invention, the base may further comprise a through hole formed to have a shape corresponding to a protrusion formed on a rear surface of the manipulation portion.

According to an embodiment of the present invention, the base and the manipulation portion may be integrally formed with each other by welding.

According to an embodiment of the present invention, the mobile terminal may further comprise a supporting portion coupled to a rear surface of the base, such that part of the base to which the manipulation portion is coupled is prevented (or reduced) from transforming towards the inside of the body, when the manipulation portion is pressed.

According to an embodiment of the present invention, the mobile terminal may further comprise a lubricating member formed on one surface of the guide portion contacting the base, and configured to reduce a frictional force between the guide portion and the base.

According to an embodiment of the present invention, the lubricating member may be formed of a non-conductor such that heat or electricity is prevented from being transferred to the base from the body.

According to an embodiment of the present invention, the mobile terminal may further comprise a display unit concaved or convexed from the front surface of the base such that a type of an external device connected to the socket is displayed.

According to an embodiment of the present invention, the mobile terminal may further comprise a battery case coupled to the body so as to cover a power supply unit mounted to the rear surface of the body. And, a concaved portion is formed close to the battery case and the body.

According to an embodiment of the present invention, the concaved portion may be formed to have a first reflection coefficient with respect to irradiated light. And, the battery case and the body each adjacent to the concaved portion and more protruding than the concaved portion, may be formed to have a second reflection coefficient higher than the first reflection coefficient.

According to another embodiment of the present invention, there is provided a mobile terminal, comprising: a case which forms the appearance of a body; a socket disposed at an inner space of the body, and to which an external device is connected; a slot penetratingly-formed at the case in correspondence to the socket; a slide door slidably-coupled to the body so as to expose or cover the socket; a guide portion provided with a lubricating member on one surface thereof contacting the slide door so as to reduce a frictional force, and coupled to rails of the slide door; and a stopper formed on a rear surface of the slide door, and configured to elastically-press grooves of the guide portion on a prescribed position to which the slide door has slid.

The present invention can have the following advantages.

Firstly, the structure to open and close the socket can be implemented in a narrower space than the conventional rail structure.

Secondly, the mobile terminal can reduce friction occurring between the slide door and the rail portion during manipulation.

Thirdly, a user can have manipulating feeling when the slot is open or closed.

Fourthly, the slide door can be fixed in a state where the slot is open or closed.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Description will now be given in detail of the exemplary embodiments, with reference to the accompanying drawings. For the sake of brief description with reference to the drawings, the same or equivalent components will be provided with the same reference numbers, and description thereof will not be repeated.

Hereinafter, a mobile terminal according to the present disclosure will be explained in more detail with reference to the attached drawings. The suffixes attached to components of the wireless speaker, such as 'module' and 'unit or portion' were used for facilitation of the detailed description of the present disclosure. Therefore, the suffixes do not have different meanings from each other. A singular expression used in the present invention may include a plural concept unless there is a contextually distinctive difference therebetween.

A terminal may be implemented in various types. For instance, the terminal in the present description includes a mobile terminal such as a portable phone, a smart phone, a notebook computer, a digital broadcasting terminal, Personal Digital Assistants (PDA), Portable Multimedia Player (PMP), a navigator, and a fixed terminal such as a digital TV, a desktop computer, etc. It is assumed that the terminal of the present invention is a mobile terminal. However, it will be obvious to those skilled in the art that the present invention may be also applicable to the fixed terminal, except for specific configurations for mobility.

Figure 1:
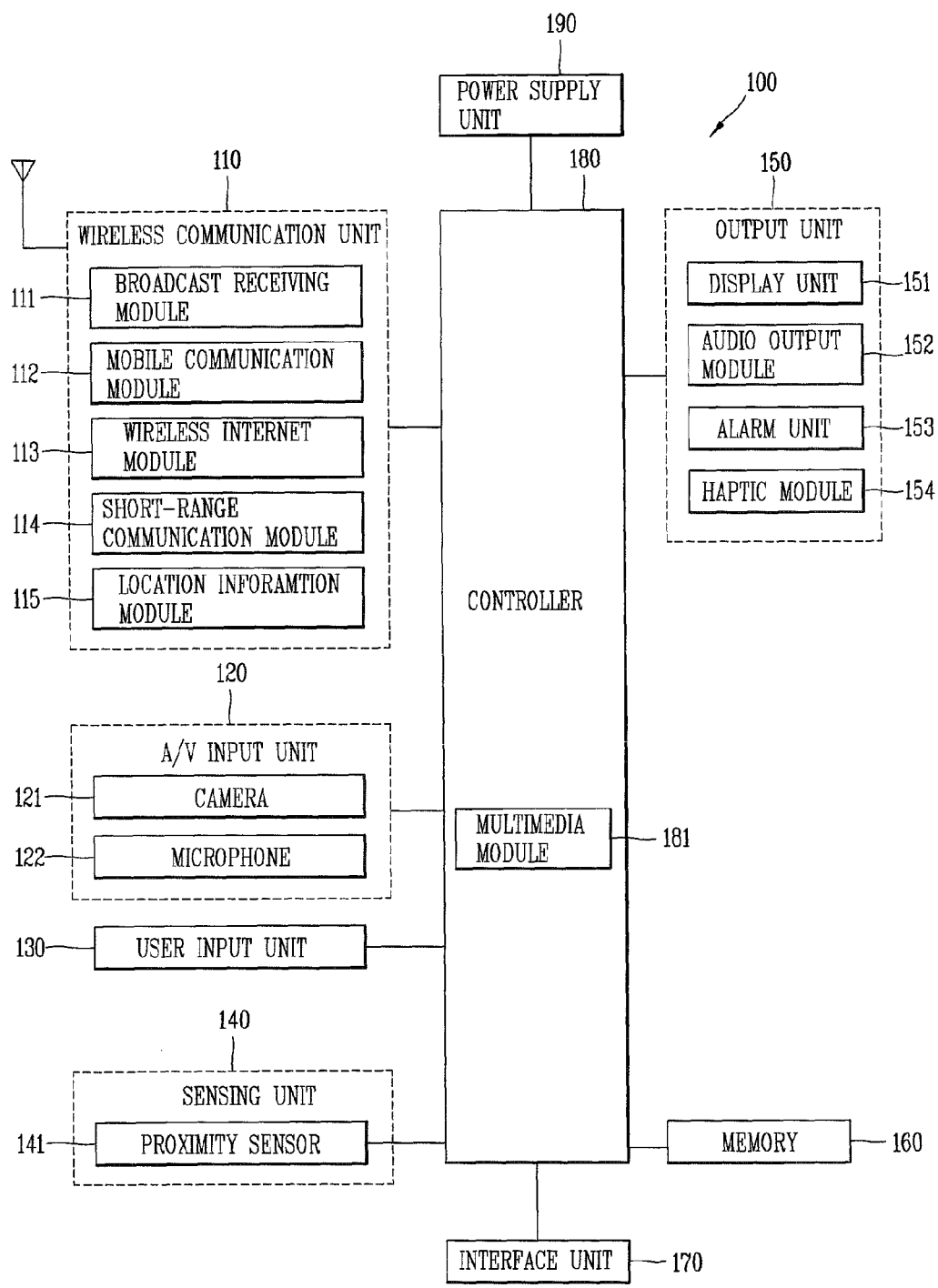
FIG. 1 is a block diagram of a mobile terminal according to an embodiment of the present invention.

The mobile terminal 100 includes a wireless communication unit 110, an A/V (Audio/Video) input unit 120, a user input unit 130, a sensing unit 140, an output unit 150, a memory 160, an interface unit 170, a controller 180, and a power supply unit 190. FIG. 1 shows the mobile terminal 100 having various components, but it is understood that implementing all of the illustrated components is not a requirement. The mobile terminal 100 may be implemented by greater or fewer components.

Hereinafter, each of the above components will be explained.

The wireless communication unit 110 typically includes one or more components allowing radio communication between the mobile terminal 100 and a wireless communication system or a network in which the mobile terminal is located. For example, the wireless communication unit 110 may include at least one of a broadcast receiving module 111, a mobile communication module 112, a wireless Internet module 113, a short-range communication module 114, and a location information module 115.

The broadcast receiving module 111 receives broadcast signals and/or broadcast associated information from an external broadcast management server (or other network entity) via a broadcast channel.

The broadcast channel may include a satellite channel and/or a terrestrial channel. The broadcast management server may be a server that generates and transmits a broadcast signal and/or broadcast associated information or a server that receives a previously generated broadcast signal and/or broadcast associated information and transmits the same to a terminal. The broadcast associated information may refer to information associated with a broadcast channel, a broadcast program or a broadcast service provider. The broadcast signal may include a TV broadcast signal, a radio broadcast signal, a data broadcast signal, and the like. Also, the broadcast signal may further include a broadcast signal combined with a TV or radio broadcast signal.

The broadcast associated information may refer to information associated with a broadcast channel, a broadcast program or a broadcast service provider. The broadcast associated information may be provided via a mobile communication network. In this case, the broadcast associated information may be received by the mobile communication module 112.

The broadcast signal may exist in various forms. For example, it may exist in the form of an electronic program guide (EPG) of digital multimedia broadcasting (DMB), electronic service guide (ESG) of digital video broadcast-handheld (DVB-H), and the like.

The broadcast receiving module 111 may be configured to receive signals broadcast by using various types of broadcast systems. In particular, the broadcast receiving module 111 may receive a digital broadcast by using a digital broadcast system such as multimedia broadcasting-terrestrial (DMB-T), digital multimedia broadcasting-satellite (DMB-S), digital video broadcast-handheld (DVB-H), the data broadcasting system known as media forward link only (MediaFLO®), integrated services digital broadcast-terrestrial (ISDB-T), etc. The broadcast receiving module 111 may be configured to be suitable for every broadcast system that provides a broadcast signal as well as the above-mentioned digital broadcast systems.

Broadcasting signals and/or broadcasting associated information received through the broadcast receiving module 111 may be stored in the memory 160.

The mobile communication module 112 transmits/receives wireless signals to/from at least one of network entities (e.g., base station, an external terminal, a server, etc.) on a mobile communication network. Here, the wireless signals may include audio call signal, video call signal, or various formats of data according to transmission/reception of text/multimedia messages.

The wireless internet module 113 supports wireless Internet access for the mobile terminal. This module may be internally or externally coupled to the mobile terminal 100. Examples of such wireless Internet access may include Wireless LAN (WLAN) (Wi-Fi), Wireless Broadband (Wibro), World Interoperability for Microwave Access (Wimax), High Speed Downlink Packet Access (HSDPA), and the like.

The short-range communication module 114 denotes a module for short-range communications. Suitable technologies for implementing this module may include BLUETOOTH, Radio Frequency IDentification (RFID), Infrared Data Association (IrDA), Ultra-WideBand (UWB), ZigBee, and the like.

The position information module 115 denotes a module for sensing or calculating a position of a mobile terminal. An example of the position information module 115 may include a Global Position System (GPS) module.

Referring to FIG. 1, the A/V input unit 120 is configured to receive an audio or video signal. The A/V input unit 120 may include a camera 121, a microphone 122 or the like. The camera 121 processes image data of still pictures or video acquired by an image capture device in a video capturing mode or an image capturing mode. The processed image frames may be displayed on a display 151.

The image frames processed by the camera 121 may be stored in the memory 160 or transmitted via the wireless communication unit 110. The camera 121 may be provided in two or more according to the configuration of the mobile terminal.

The microphone 122 may receive sounds (audible data) via a microphone in a phone call mode, a recording mode, a voice recognition mode, and the like, and can process such sounds into audio data. The processed audio (voice) data may be converted for output into a format transmittable to a mobile communication base station via the mobile communication module 112 in case of the phone call mode. The microphone 122 may implement various types of noise canceling (or suppression) algorithms to cancel (or suppress) noise or interference generated in the course of receiving and transmitting audio signals.

The user input unit 130 may generate key input data from commands entered by a user to control various operations of the mobile communication terminal. The user input unit 130 may include a keypad, a dome switch, a touch pad (e.g., a touch sensitive member that detects changes in resistance, pressure, capacitance, etc. due to being contacted) a jog wheel, a jog switch, and the like.

The sensing unit 140 detects a current status (or state) of the mobile terminal 100 such as an opened or closed state of the mobile terminal 100, a location of the mobile terminal 100, the presence or absence of user contact with the mobile terminal 100, the orientation of the mobile terminal 100, an acceleration or deceleration movement and direction of the mobile terminal 100, etc., and generates commands or signals for controlling the operation of the mobile terminal 100. For example, when the mobile terminal 100 is implemented as a slide type mobile phone, the sensing unit 140 may sense whether the slide phone is open or closed. In addition, the sensing unit 140 can detect whether or not the power supply unit 190 supplies power or whether or not the interface unit 170 is coupled with an external device. The sensing unit 140 may include a proximity sensor 141.

The output unit 150 is configured to provide outputs in a visual, audible, and/or tactile manner. The output unit 150 may include the display 151, an audio output module 152, an alarm unit 153, a haptic module 154, and the like.

The display 151 may display information processed in the mobile terminal 100. For example, when the mobile terminal 100 is in a phone call mode, the display 151 may display a User Interface (UI) or a Graphic User Interface (GUI) associated with a call or other communication (such as text messaging, multimedia file downloading, etc.). When the mobile terminal 100 is in a video call mode or image capturing mode, the display 151 may display a captured image and/or received image, a UI or GUI.

The display 151 may include at least one of a Liquid Crystal Display (LCD), a Thin Film Transistor-LCD (TFT-LCD), an Organic Light Emitting Diode (OLED) display, a flexible display, a three-dimensional (3D) display, or the like.

Some of these displays may be configured to be transparent so that outside may be seen therethrough, which may be referred to as a transparent display. A representative example of the transparent display may include a Transparent Organic Light Emitting Diode (TOLED), and the like. The rear surface portion of the display 151 may also be implemented to be optically transparent. Under this configuration, a user can view an object positioned at a rear side of a body through a region occupied by the display 151 of the body.

The display 151 may be implemented in two or more in number according to a configured aspect of the mobile terminal 100. For instance, a plurality of displays may be arranged on one surface integrally or separately, or may be arranged on different surfaces.

Here, if the display 151 and a touch sensitive sensor (referred to as a touch sensor) have a layered structure therebetween, the structure may be referred to as a touch screen. The display 151 may be used as an input device rather than an output device. The touch sensor may be implemented as a touch film, a touch sheet, a touch pad, and the like.

The touch sensor may be configured to convert changes of a pressure applied to a specific part of the display 151, or a capacitance occurring from a specific part of the display 151, into electric input signals. Also, the touch sensor may be configured to sense not only a touched position and a touched area, but also a touch pressure.

When touch inputs are sensed by the touch sensors, corresponding signals are transmitted to a touch controller (not shown). The touch controller processes the received signals, and then transmits corresponding data to the controller 180. Accordingly, the controller 180 may sense which region of the display 151 has been touched.

Referring to FIG. 1, a proximity sensor 141 may be arranged at an inner region of the mobile terminal blocked by the touch screen, or near the touch screen. The proximity sensor 141 indicates a sensor to sense presence or absence of an object approaching to a surface to be sensed, or an object disposed near a surface to be sensed, by using an electromagnetic field or infrared rays without a mechanical contact. The proximity sensor 141 has a longer lifespan and a more enhanced utility than a contact sensor.

The proximity sensor 141 may include a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and so on. When the touch screen is implemented as a capacitance type, proximity of a pointer to the touch screen is sensed by changes of an electromagnetic field. In this case, the touch screen (touch sensor) may be categorized into a proximity sensor.

Hereinafter, for the sake of brief explanation, a status that the pointer is positioned to be proximate onto the touch screen without contact will be referred to as 'proximity touch', whereas a status that the pointer substantially comes in contact with the touch screen will be referred to as 'contact touch'. For the position corresponding to the proximity touch of the pointer on the touch screen, such position corresponds to a position where the pointer faces perpendicular to the touch screen upon the proximity touch of the pointer.

The proximity sensor 141 senses proximity touch, and proximity touch patterns (e.g., distance, direction, speed, time, position, moving status, etc.). Information relating to the sensed proximity touch and the sensed proximity touch patterns may be output onto the touch screen.

The audio output module 152 may convert and output as sound audio data received from the wireless communication unit 110 or stored in the memory 160 in a call signal reception mode, a call mode, a record mode, a voice recognition mode, a broadcast reception mode, and the like. Also, the audio output module 152 may provide audible outputs related to a particular function performed by the mobile terminal 100 (e.g., a call signal reception sound, a message reception sound, etc.). The audio output module 152 may include a speaker, a buzzer, and so on.

The alarm unit 153 may provide outputs to inform about the occurrence of an event of the mobile terminal 100. Typical events may include call reception, message reception, key signal inputs, a touch input, etc. In addition to audio or video outputs, the alarm unit 153 may provide outputs in a different manner to inform about the occurrence of an event. The video signal or the audio signal may be output via the display 151 or the audio output module 152. Accordingly, the display 151 or the audio output module 152 may be classified as part of the alarm unit 153.

The haptic module 154 generates various tactile effects which a user can feel. A representative example of the tactile effects generated by the haptic module 154 includes vibration. Vibration generated by the haptic module 154 may have a controllable intensity, a controllable pattern, and so on. For instance, different vibration may be output in a synthesized manner or in a sequential manner.

The haptic module 154 may generate various tactile effects, including not only vibration, but also arrangement of pins vertically moving with respect to a skin being touched (contacted), air injection force or air suction force through an injection hole or a suction hole, touch by a skin surface, presence or absence of contact with an electrode, effects by stimulus such as an electrostatic force, reproduction of cold or hot feeling using a heat absorbing device or a heat emitting device, and the like.

The haptic module 154 may be configured to transmit tactile effects (signals) through a user's direct contact, or a user's muscular sense using a finger or a hand. The haptic module 154 may be implemented in two or more in number according to the configuration of the mobile terminal 100.

The memory 160 may store a program for the processing and control of the controller 180. Alternatively, the memory 160 may temporarily store input/output data (e.g., phonebook data, messages, still images, video and the like). Also, the memory 160 may store data relating to various patterns of vibrations and audio output upon the touch input on the touch screen.

The memory 160 may be implemented using any type of suitable storage medium including a flash memory type, a hard disk type, a multimedia card micro type, a memory card type (e.g., SD or DX memory), Random Access Memory (RAM), Static Random Access Memory (SRAM), Read-Only Memory (ROM), Electrically Erasable Programmable Read-only Memory (EEPROM), Programmable Read-only Memory (PROM), magnetic memory, magnetic disk, optical disk, and the like. Also, the mobile terminal 100 may operate a web storage which performs the storage function of the memory 160 on the Internet.

The interface unit 170 may generally be implemented to interface the mobile terminal with external devices. The interface unit 170 may allow a data reception from an external device, a power delivery to each component in the mobile terminal 100, or a data transmission from the mobile terminal 100 to an external device. The interface unit 170 may include, for example, wired/wireless headset ports, external charger ports, wired/wireless data ports, memory card ports, ports for coupling devices having an identification module, audio Input/Output (I/O) ports, video I/O ports, earphone ports, and the like.

The identification module may be configured as a chip for storing various information required to authenticate an authority to use the mobile terminal 100, which may include a User Identity Module (UIM), a Subscriber Identity Module (SIM), a Universal Subscriber Identity Module (USIM), and the like. Also, the device having the identification module (hereinafter, referred to as 'identification device') may be implemented in a type of smart card. Hence, the identification device can be coupled to the mobile terminal 100 via a port.

Also, the interface unit 170 may serve as a path for power to be supplied from an external cradle to the mobile terminal 100 when the mobile terminal 100 is connected to the external cradle or as a path for transferring various command signals inputted from the cradle by a user to the mobile terminal 100. Such various command signals or power inputted from the cradle may operate as signals for recognizing that the mobile terminal 100 has accurately been mounted to the cradle.

The controller 180 typically controls the overall operations of the mobile terminal 100. For example, the controller 180 performs the control and processing associated with telephony calls, data communications, video calls, and the like. The controller 180 may include a multimedia module 181 which provides multimedia playback. The multimedia module 181 may be configured as part of the controller 180 or as a separate component.

The controller 180 can perform a pattern recognition processing so as to recognize writing or drawing input on the touch screen as text or image.

The power supply unit 190 serves to supply power to each component by receiving external power or internal power under control of the controller 180.

Various embodiments described herein may be implemented in a computer-readable medium using, for example, software, hardware, or some combination thereof.

For a hardware implementation, the embodiments described herein may be implemented within one or more of Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, micro-controllers, micro processors, other electronic units designed to perform the functions described herein, or a selective combination thereof. In some cases, such embodiments are implemented by the controller 180.

For software implementation, the embodiments such as procedures and functions may be implemented together with separate software modules each of which performs at least one of functions and operations. The software codes can be implemented with a software application written in any suitable programming language. Also, the software codes may be stored in the memory 160 and executed by the controller 180.

Figure 2:
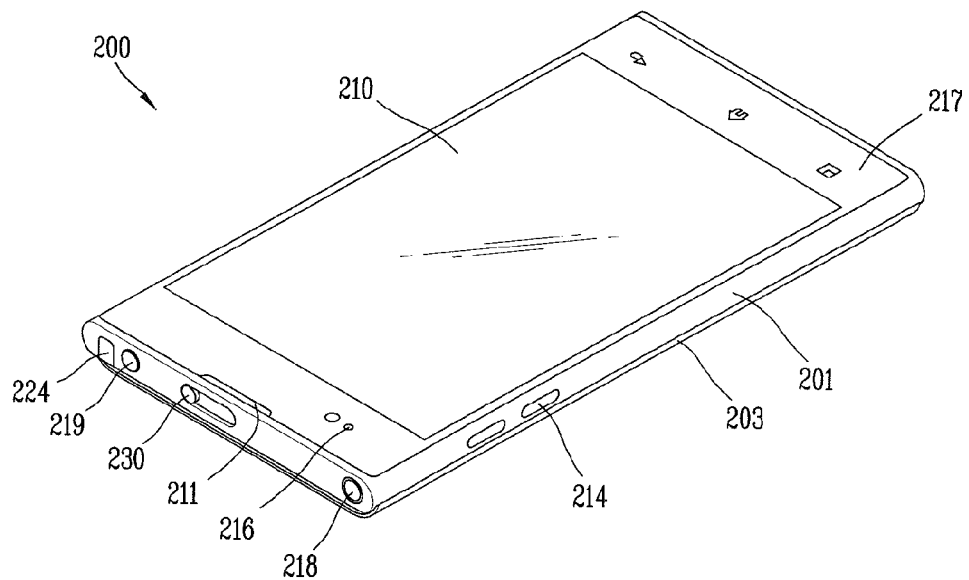
FIG. 2 is a front perspective view of a mobile terminal according to an embodiment.
Figure 3:
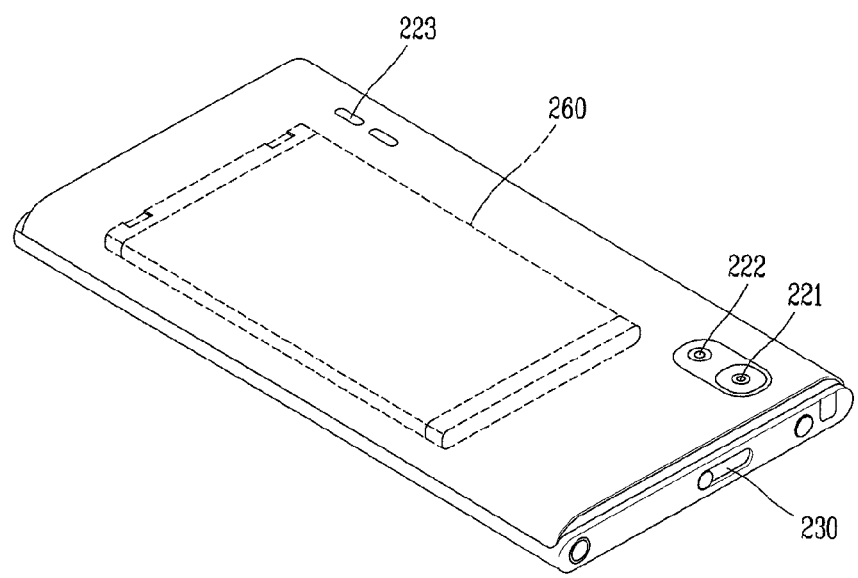
FIG. 3 is a rear perspective view of the mobile terminal of FIG. 2.

FIG. 2 is a front perspective view of a mobile terminal according to the present invention, and FIG. 3 is a rear perspective view of the mobile terminal of FIG. 2.

Referring to FIGS. 2 and 3, the mobile terminal 200 according to the present invention is a bar type mobile terminal. However, the present invention is not limited to this, but may be applied to a slide type in which two or more bodies are coupled to each other so as to perform a relative motion, a folder type, or a swing type, a swivel type and the like. Further, the mobile terminal of the present invention may be also applicable to any portable electronic device having a camera and a flash, e.g., a portable phone, a smart phone, a notebook computer, a digital broadcasting terminal, Personal Digital Assistants (PDA), Portable Multimedia Player (PMO), etc.

A case (casing, housing, cover, etc.) which forms the appearance of a body may include a front case 201, a rear case 202 covering an opposite surface to the front case 201, a circuit board 270, and a cover 203 which constitutes the rear surface of the mobile terminal 200 by being coupled to the rear case 202. A space formed by the front case 201 and the rear case 202 may accommodate various components therein. Such cases may be formed by injection-molded synthetic resin, or may be formed using a metallic material such as stainless steel (STS) or titanium (Ti).

On the front surface of the body, may be disposed a display 210, a first audio output unit 211, a front camera 216, a side key 214, an interface unit 215 and a user input unit 217.

The display 210 includes a liquid crystal display (LCD) module, organic light emitting diodes (OLED), e-paper, etc. each for visually displaying information. The display 210 may include a touch sensing means for inputting information in a touch manner. Hereinafter, the display 210 including the touch sensing means is called 'touch screen'. Once part on the touch screen 210 is touched, content corresponding to the touched position is input. The content input in a touch manner, may be characters, or numbers, or menu items which can be set in each mode. The touch sensing means may be transmissive so that the display can be viewed, and may include a structure for enhancing visibility of the touch screen at a bright place. Referring to FIG. 2, the touch screen 210 occupies most of the front surface of the front case 201.

The first audio output unit 211 may be implemented as a receiver for transmitting a call sound to a user's ear, or a loud speaker for outputting each type of alarm sound or a playback sound of multimedia.

The front camera 216 processes image frames such as still images or moving images, obtained by an image sensor in a video call mode or a capturing mode. The processed image frames may be displayed on the display 210.

The image frames processed by the front camera 216 may be stored in the memory 160, or may be transmitted to the outside through the wireless communication unit 110. The front camera 216 may be implemented in two or more according to a user's interface.

The user input unit 217 is manipulated to receive a command for controlling the operation of the mobile terminal 200, and may include a plurality of input keys. The input keys may be referred to as manipulation portions, and may include any type of ones that can be manipulated in a user's tactile manner.

For instance, the user input unit 217 may be implemented as a dome switch, or a touch screen, or a touch pad for inputting commands or information in a user's push or touch manner. Alternatively, the user input unit 217 may be implemented, for example, as a wheel for rotating a key, a jog, or a joystick. The user input unit 217 is configured to input various commands such as START, END and SCROLL.

A side key 214, an interface unit 215, an audio input unit 213, etc. are disposed on the side surface of the front case 201.

The side key 214 may be called 'manipulation unit', and may be configured to receive commands for controlling the operation of the mobile terminal 200. The side key 214 may include any type of ones that can be manipulated in a user's tactile manner. Content input by the side key 214 may be variously set. For instance, through the side key 214, may be input commands such as controlling the front and rear cameras 216 and 221, controlling the level of sound output from the audio output unit 211, and converting a current mode of the display 210 into a touch recognition mode.

The audio output unit 213 may be implemented as a microphone for receiving a user's voice, other sound, etc.

The interface unit 215 serves a path through which the mobile terminal 200 performs data exchange, etc. with an external device. For example, the interface unit 215 may be at least one of a connection terminal through which the mobile terminal 200 is connected to an ear phone by cable or radio, a port for local area communication, e.g., an infrared data association (IrDA) port, a Bluetooth portion, a wireless LAN port, and power supply terminals for supplying power to the mobile terminal 200. The interface unit 215 may be a card socket for accommodating an external card such as a subscriber identification module (SIM) card, a user identity module (UIM) card or a memory card for storing information.

A power supply unit 260 and the rear camera 221 are disposed on the rear surface of the body.

A flash 222 and a mirror (not shown) may be disposed close to the rear camera 221. When capturing an object by using the rear camera 221, the flash 222 provides light onto the object.

When the user captures an image of himself/herself by using the rear camera 221, the mirror can be used for the user to look at himself/herself therein.

The rear camera 221 may face a direction which is opposite to a direction faced by the front camera 216, and may have different pixels from those of the front camera 216.

For example, the front camera 216 may operate with relatively lower pixels (lower resolution). Thus, the front camera 216 may be useful when a user can capture his face and send it to another party during a video call or the like. On the other hand, the rear camera 221 may operate with a relatively higher pixels (higher resolution) such that it can be useful for a user to obtain higher quality pictures for later use. The front camera 216 and the rear camera 221 may be installed at the body so as to rotate or pop-up.

A power supply unit 260 is configured to supply power to the mobile terminal 200. The power supply unit 260 may be mounted in the body, or may be detachably mounted to the body.

Figure 4:
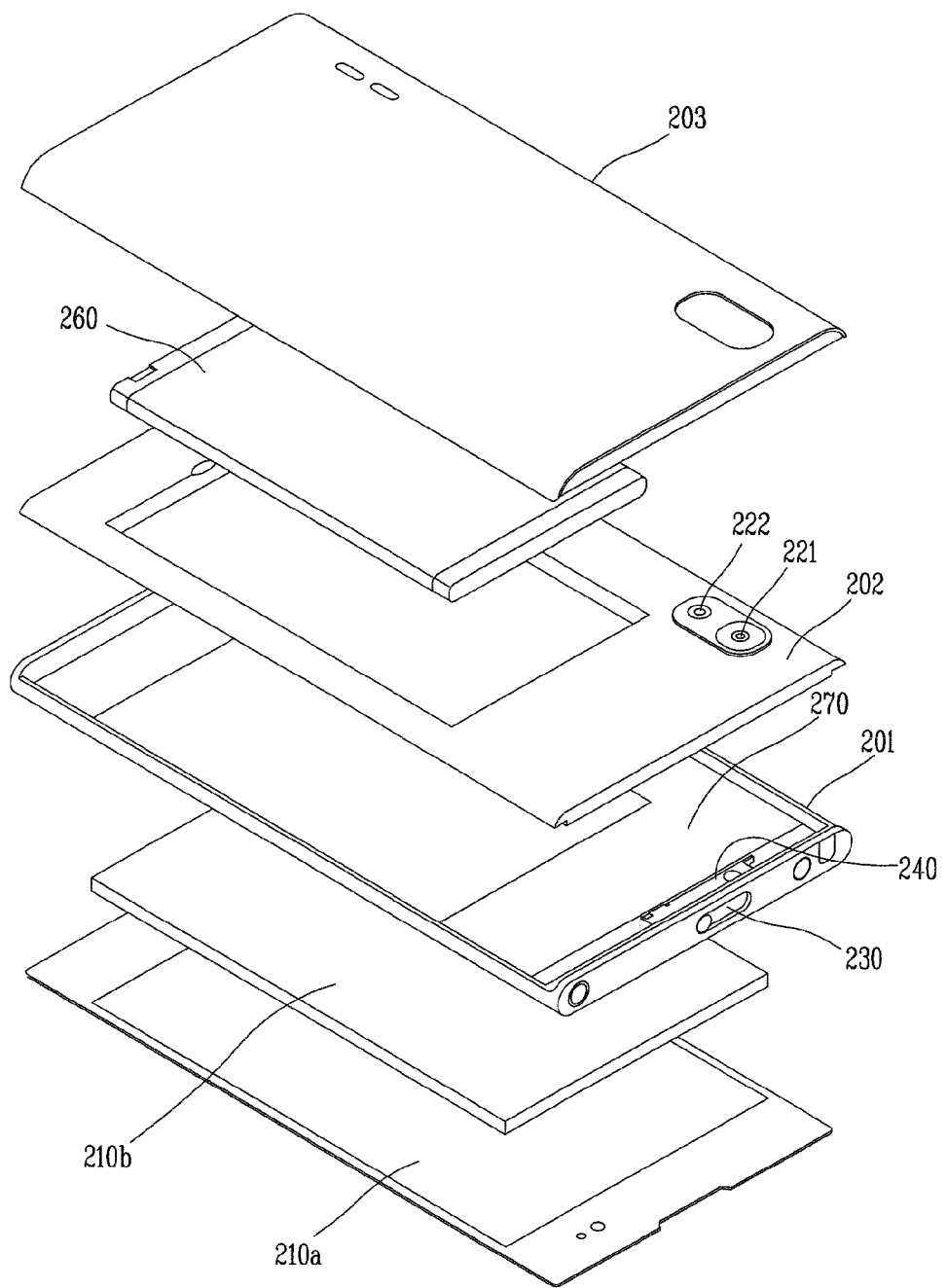
FIG. 4 is a disassembled perspective view of the mobile terminal of FIG. 3.
Figure 5A:
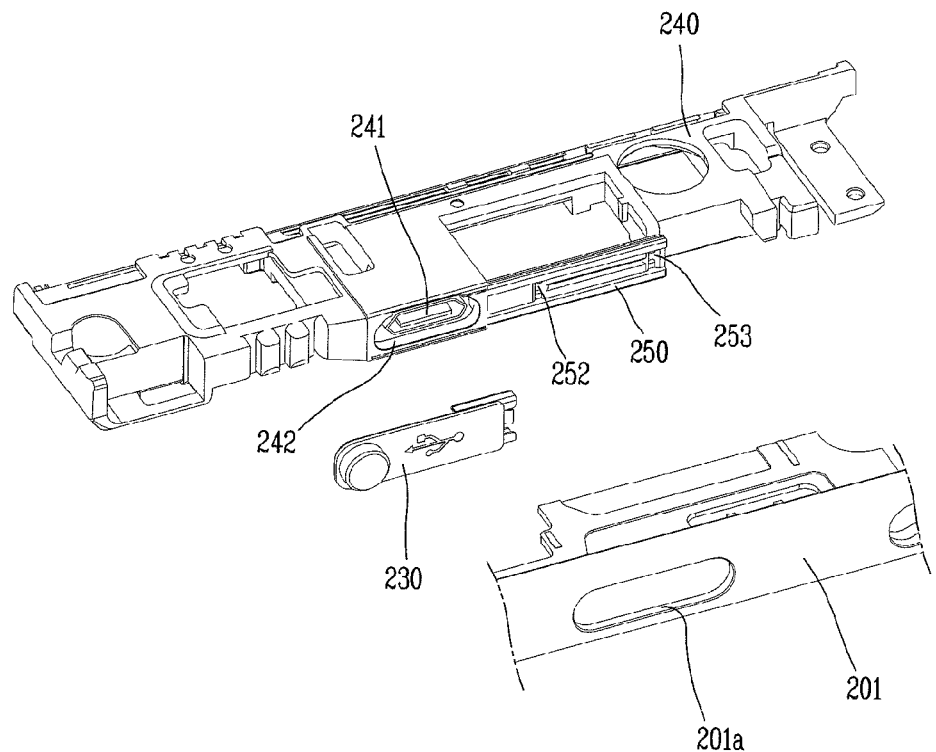
FIG. 5A is a disassembled perspective view showing part where a socket of FIG. 4 is formed.
Figure 5B:
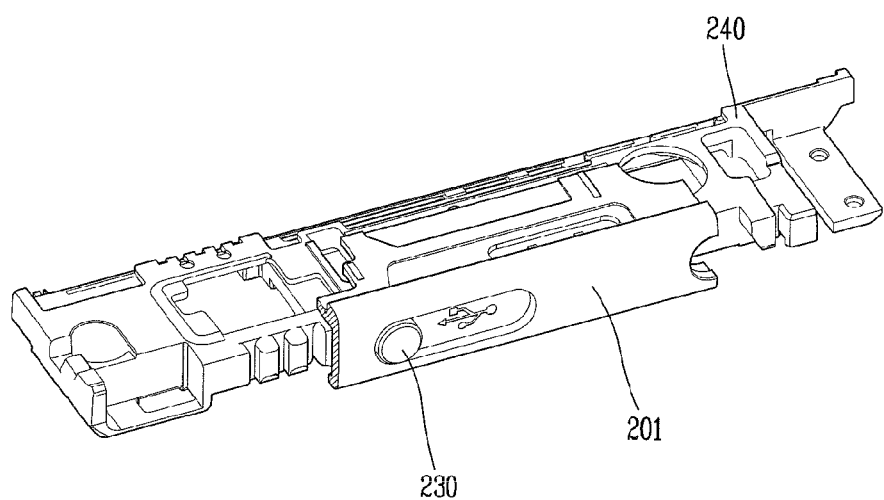
FIG. 5B is a perspective view showing a state that components of FIG. 5A are coupled to each other.

FIG. 4 is a disassembled perspective view of the mobile terminal of FIG. 3, FIG. 5A is a disassembled perspective view showing part where a socket of FIG. 4 is formed, and FIG. 5B is a perspective view showing a state that components of FIG. 5A are coupled to each other.

Referring to FIGS. 4 and 5, a circuit board 270 is disposed at an inner space of a body formed by the front case 201 and the rear case 202. As shown, the circuit board 270 may be mounted to the rear case 202, or may be mounted to an inner structure. The circuit board 270 may be configured as an example of the controller for executing each type of function of the mobile terminal.

A display 210b electrically connected to the circuit board 270 is disposed on one surface of the circuit board 270. The display 210b may have an area corresponding to a region where light incident onto a window 210a is transmissive. This can allow a user to recognize, from the outside, visual information output from the display 210b.

A socket 241 electrically connected to the circuit board 270 and connectable to an external device, is disposed at the inner space of the body. Hereinafter, the present invention will be explained under an assumption that the socket 241 and a slide door 230 for opening and closing the socket 241 by sliding, are disposed on the side surface of the body. However, the present invention is not limited to this. For instance, the socket 241 and the slide door 230 may be disposed on the rear surface of the body.

An external device inserted into the socket 241 may be implemented as a Scriber Identify Module (SIM) card, for instance. The SIM card indicates a card for storing personal information. A memory card called Micro SD, such as T-Flash Card, and a modem chip such as Mobile Station Modem (MSM) Chip can be inserted into the socket 241. And, an interface device such as a Multimedia Interface (MMI) Connector may be inserted into the socket 241. Here, the interface device may be implemented as a port for charging, call earphone, and data cable.

The socket 241 can be exposed to the outside through a slot 201a formed at any one of the front case 201 and the rear case 202. Accordingly, it is assumed that both of the front case 201 and the rear case 202 are called case 201.

The slot 201a is formed at the case 201 in correspondence to the socket 241, and the socket 241 is exposed to the outside through the slot 201a. The slot 201a is formed to be extend in one direction. For instance, the slot 201a may extend along the side surface of the case 201 which forms the edge of the body.

An accommodation portion 242 for accommodating the socket 241 may be formed at a frame 240 for supporting the inside of the mobile terminal. As shown, the accommodation portion 242 may form a space for accommodating the socket 241, by more protruding from the periphery, or by being recessed from one surface of the frame 240. The accommodation portion 242 may support at least one side surface of the socket 241, so that the socket 241 may be stably fixed eve if an external force is applied to the socket 241.

The slide door 230 is slidable by being accommodated in the case. The slide door 230 is configured to cover the socket 241 or expose the socket 241 to the outside, by sliding in one direction.

The slide door 230 may include a base 231 and a manipulation portion 233. The base 231 has a shape of a thin plate, and is configured to open and close the slot 201a by sliding. The manipulation portion 233 protrudes from the base 231 to thereby be inserted into the slot 201a, and performs a sliding motion in the slot 201a. Accordingly, a user can easily open and close the slot 201a by sliding the manipulation portion 233.

The guide portion 250 is configured to support sliding-motion of the slide door 230 by being coupled to the slide door 230. The guide portion 250 may be fixed in a fitted manner into the accommodation portion 242 and the inner side wall of the case 201 which forms a mounting groove. Alternatively, the guide portion 250 may be fixed by a hook structure. The guide portion 250 may form a sliding path of the slide door 230.

Hereinafter, configurations of the slide door 230 and the guide portion 250, and a mechanism therebetween will be explained in more detail.

Figure 6A:
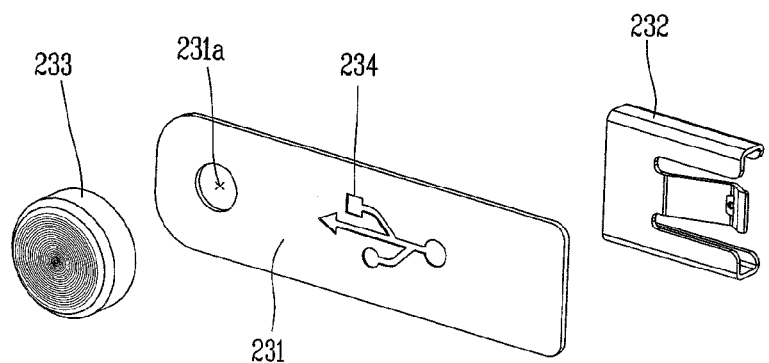
FIG. 6A is a front perspective view of a slide door of FIG. 5.
Figure 6B:
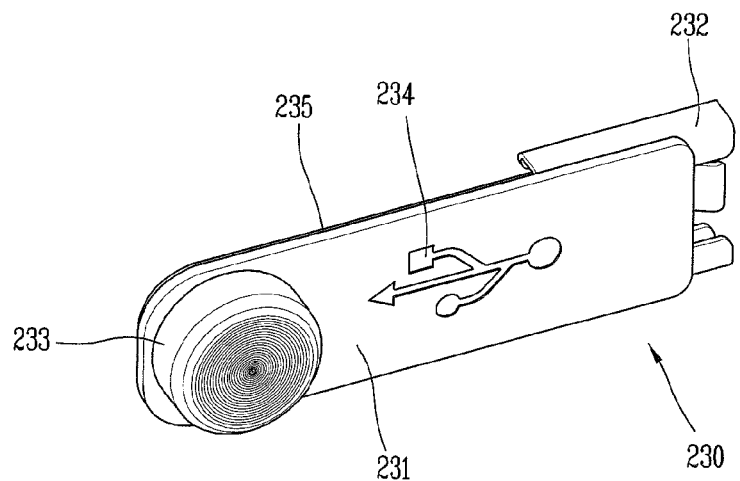
FIG. 6B is a rear perspective view of the slide door of FIG. 5.
Figure 6C:
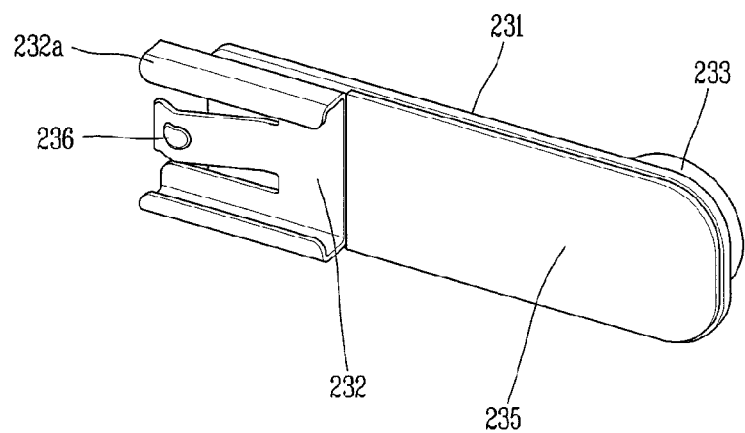
FIG. 6C is a disassembled perspective view of the slide door of FIG. 5.
Figure 7:
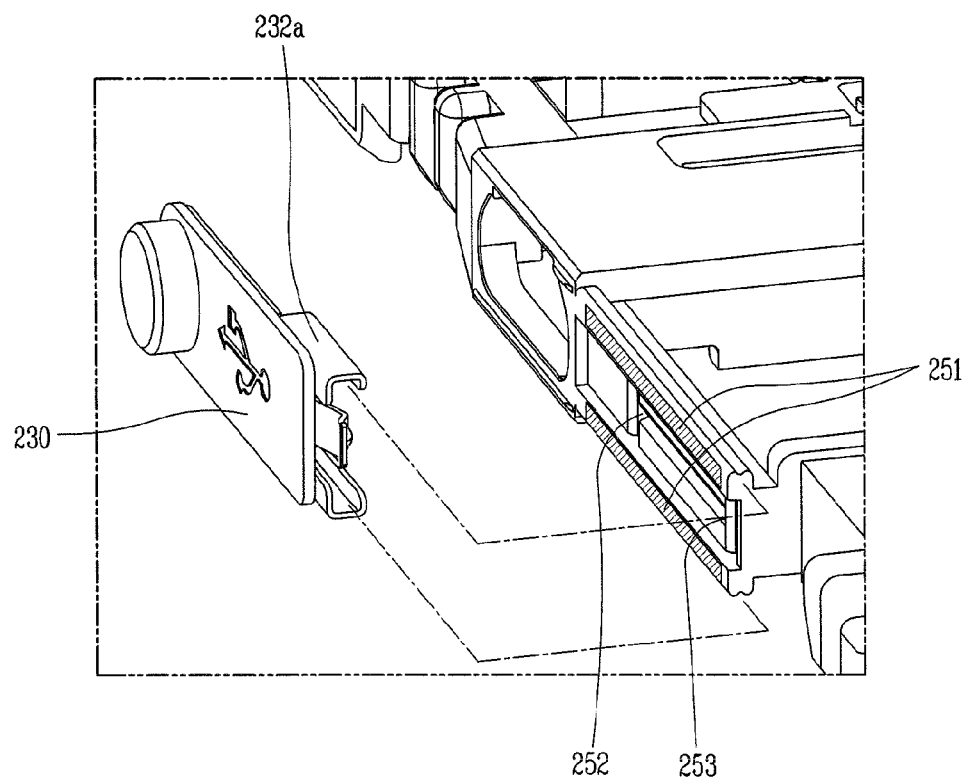
FIG. 7 is an enlarged view of a guide portion of FIG. 5.

FIG. 6A is a front perspective view of the slide door 230 of FIG. 5, FIG. 6B is a rear perspective view of the slide door 230 of FIG. 5, FIG. 6C is a disassembled perspective view of the slide door 230 of FIG. 5, and FIG. 7 is an enlarged view of the guide portion 250 of FIG. 5.

Referring to FIGS. 5 to 7, the slide door 230 is formed to perform a sliding motion on the guide portion 250. The slide door 230 may be formed of a metallic material or synthetic resin. Alternatively, the slide door 230 may be mainly formed of synthetic resin, and may be partially formed of metal. Still alternatively, the slide door 230 may be mainly formed of metal, and may be partially formed of synthetic resin.

The slide door 230 may include a base 231, a rail portion 232 and a stopper 236.

The base 231 has a shape of a thin plate. A display unit 234 for displaying a type of an external device connected to the socket 241, may be formed on one surface of the base 231. The display unit 234 may be concaved or convexed from one surface of the base 231.

The display unit 234 may be provided with patterns such as symbols, characters and diagrams for displaying one of the aforementioned external devices.

A supporting portion 235 may be formed on the rear surface of the base 231. The supporting portion 235 may be formed of a thin adhesion sheet. For instance, a teflon tape may be used. Since the base 231 is formed of a thin plate, part thereof pressed by a user towards the inside of the mobile terminal, may be downward deformed. In order to solve such problem, the supporting portion 235 is formed on the rear surface of the base 231 in the present invention. This can reduce or prevent such deformation by an elastic force and a restoration force applied to the respective components of the supporting portion 235. That is, the supporting portion 235 supports the base 231 not to be deformed.

The rail portion 232 is coupled to the rear surface of the base 231. This can prevent exposure of the rail portion to the outside through the slot, thereby implementing the uniform appearance of the mobile terminal. Further, as the rail portion is not exposed to the outside, can be prevented an inferior slide operation of the slide door occurring as dust is introduced into the rail portion. The rail portion 232 may be integrally formed with the base 231. Alternatively, the rail portion 232 may be coupled to the base 231 by welding.

The rail portion 232 includes rails 232a configured to enclose at least part of the guide portion 250. The rails 232a are bent from two side ends of the base 231 so as to enclose the guide portion 250. The rails 232a have a thickness corresponding to that of the side surface of the guide portion 250. As shown, the rails 232a are bent from the circumference of the rail portion 232 in a thickness direction, extend, and then are bent to enclose the guide portion 250. In order to reduce friction with the guide portion 250, the rails 232 are provided with an opening.

The rail portion 232 is not formed to plane-contact the guide portion, but is formed to enclose the two side ends of the guide portion 250. Under such configuration, the slide door including the rail portion 232 can have a smaller area than that of the conventional art.

The area of the slide door corresponds to the thickness of the mobile terminal. Accordingly, the thickness of the mobile terminal can be reduced by a reduced area of the slide door.

A stopper 236 is formed between the rails 232a. The stopper 236 is bent, from one side of the rail portion 232, towards grooves 252 and 253 of the guide portion 250. The stopper 236 may have a cantilever shape elastically transformed.

As the stopper 236 is elastically fitted into the grooves 252 and 253 of the guide portion 250, the position of the slide door 230 having slid can be maintained. If the slide door 230 is pushed or pulled by a force more than a predetermined value, the coupled state between the stopper 236 and the grooves 252 and 253 is released. At the same time, the slide door 230 can perform a sliding motion in one direction. Part of the stopper 236 contacting the grooves 252 and 253 of the guide portion 250, may be formed in a 'V' or 'U' shape.

The slide door 230 may include a manipulation portion 233. The manipulation portion 233 protrudes from the front surface of the base 231 in a cylindrical shape.

A plurality of concentric patterns concaved as a plurality of circular grooves may be formed on the front surface of the manipulation portion 233. The patterns may be formed by irradiating laser on one surface of the pressing manipulation portion 219 to thereby process the concentric patterns. The manipulation portion 233 may be formed in a smooth curve shape for an enhanced design. However, in this case, the following problem may occur. If a user pushes or pulls the front surface of the manipulation portion 233 using his or her finger when closing or opening the socket 241, the friction on the surface of the manipulation portion 233 is reduced to cause the user's finger to slide. In order to solve such problem, the plurality of concentric patterns are formed on the front surface of the manipulation portion 233. This can increase a frictional force between the front surface of the manipulation portion 233 and the user's fingers, thereby allowing the user to more easily manipulate the manipulation portion 233.

A protrusion is formed on the rear surface of the manipulation portion 233, and a through hole 231a is formed at the base 231. The protrusion may be inserted into the through hole, and then may be integrated with the through hole by welding.

The guide portion 250 is coupled to the body, and is disposed close to the slot 201a on the same plane. The guide portion 250 according to one embodiment of the present invention, may be coupled to a middle frame configured to support the inside of the mobile terminal between the front case and the rear case.

The guide portion 250 includes a first groove 252 and a second groove 253 corresponding to sliding positions of the slide door 230. The first groove 252 is formed close to the slot 201a, and the second groove 253 is spaced from the slot 201a. In a state where one end of the stopper 236 is inserted into the first groove 252, the slide door 230 covers the socket 241. On the other hand, in a state where one end of the stopper 236 is inserted into the second groove 253, the slide door 230 opens the socket 241.

The guide portion 250 may be recessed from one surface of the frame 240, and may be provided with a groove rail extending in a direction connected from the first groove 252 to the second groove 253. One end of the stopper 236 may be moveable along the groove rail.

A lubricating member 251 is formed on one surface of the guide portion 250 contacting the base 231. The lubricating member 251 can reduce noise occurring from a frictional force between the base 231 and the guide portion 250, and can allow a sliding operation of the slide door. As the lubricating member 251, may be used a material having a low surface roughness.

The lubricating member 251 may be formed of a nonconductor. In this case, the heat or electricity can be prevented (or reduced) from being transferred to the manipulation portion 233 from the body.

Figure 8A:
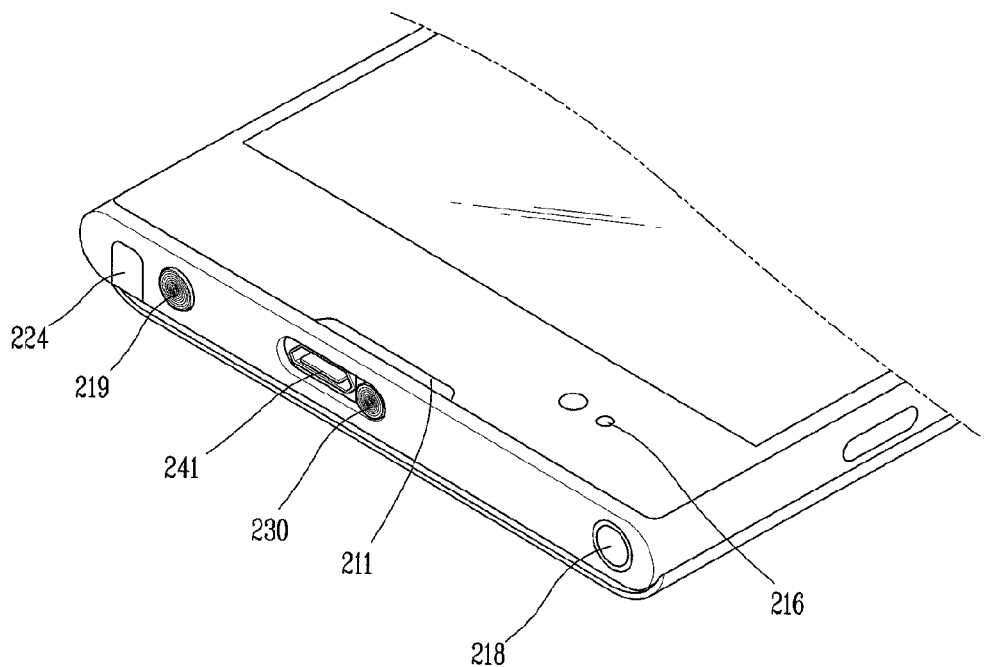
FIGS. 8A and 8B are views showing a closed state and an open state of a socket according to an operation state of a slide door according to an embodiment of the present invention.
Figure 8B:
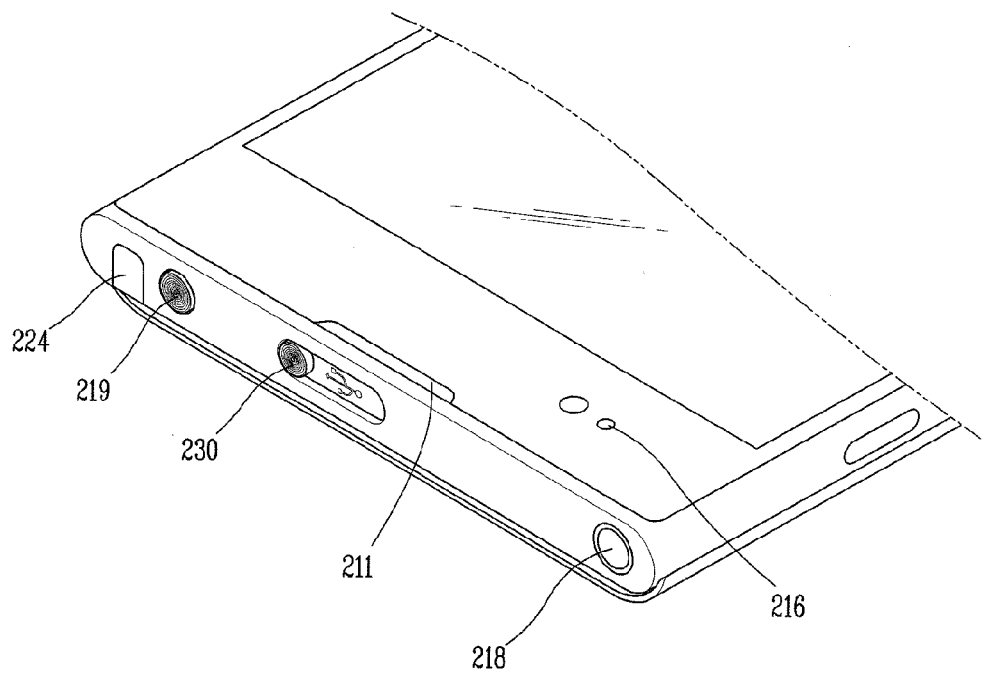

FIGS. 8A and 8B are views showing an open (exposed) state and a closed state (covered state) of the slot 201a according to an operation state of the slide door 230 according to the present invention.

As shown, the slot 201a may be closed or opened as a user pushes or pulls the manipulation portion 233. In a closed state, the manipulation portion 233 approaches to one end of the slot 201a. On the other hand, in an open state, the manipulation portion 233 approaches to another end of the slot 201a.

Figure 9:
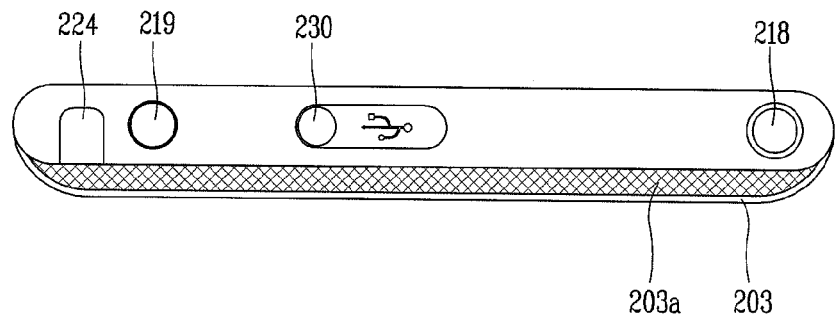
FIG. 9 is a side view of a mobile terminal according to an embodiment of the present invention.

FIG. 9 is a side view of a mobile terminal according to an embodiment of the present invention.

A pressing manipulation portion 219 having the same or similar multiple concentric patterns as/to the manipulation portion 233, may be provided at a position spaced from the manipulation portion 233.

The pressing manipulation portion 219 is configured to execute one of preset functions of the mobile terminal as a user's push input is applied thereto.

The manipulation portion 233 and the pressing manipulation portion 219 are formed to have similar shapes. This can enhance the appearance of the mobile terminal, and implement a unified design of the mobile terminal. However, the operation method of the manipulation portion 233 and the pressing manipulation portion 219 are different from each other. More specifically, the manipulation portion 233 serves to open and close the slot 201a to which an external device is connected, by being pushed or pulled by a user. On the other hand, the pressing manipulation portion 219 serves to execute a preset function of the mobile terminal by receiving a user's push input.

A receiving antenna 224 for DMB only may be retractably formed on one surface of the mobile terminal where the manipulation portion 233 and the pressing manipulation portion 219 are arranged. And, an earphone socket 218 may be disposed on the same plane of the mobile terminal where the manipulation portion 233 and the pressing manipulation portion 219 are arranged, thereby providing a unified design of the mobile terminal.

A battery case 203 is coupled to the rear surface of the mobile terminal. The battery case 203 is configured to cover the power supply unit 260 of the mobile terminal. The power supply unit 260 may be integrally coupled to the body, or may be detachably coupled to the body.

A concaved portion 203a may be formed on one side surface of the battery case 203. In a state where the battery case 203 and the body are coupled to each other, the concaved portion 203a is implemented as a groove concaved towards the inside of the body. That is, the concaved portion 203a is formed to be concaved from the neighboring battery case 203 and the neighboring body.

The concaved portion 203a looks darker than the periphery, because it has been recessed from the periphery. The battery case may seem to float over the body without having a connection part therebetween. Such technique is called 'Floating Mass'.

The concaved portion 203a may be formed to have a first reflection coefficient, and the battery case 203 and the body each adjacent to the concaved portion 203a may be formed to have a second reflection coefficient. The second reflection coefficient may be higher than the first reflection coefficient.

The concaved portion 203a having the first reflection coefficient may look darker than the periphery. As the concaved portion 203a has a lower reflection coefficient than the periphery, the floating mass effect can be more enhanced.

In order to control the reflection coefficient, the surface roughness, the colors of the battery cover and the body, etc. can be controlled.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A mobile terminal, comprising:
   a body having a slot at one side thereof;
   a socket mounted to the body, and to which an external device is connected through the slot;
   a slide door coupled to the body so as to expose or cover the socket; and
   a guide portion formed next to the socket, and configured to guide motion of the slide door,
   wherein the slide door comprises:
      a base having a plate shape;
      a manipulation portion protruding from a front surface of the base, and exposed to the outside through the slot; and
      a rail portion formed to be slidable along the guide portion, and coupled to a rear surface of the base so as to be covered by the base, and
   wherein the rail portion comprises:
      rails bent from two side ends of the base for enclosing the guide portion; and
      a stopper formed between the rails and bent from one side of the rail portion toward the guide portion and having an elastically deformed cantilever shape, and
   wherein the guide portion comprises:
      a groove rail recessed from one side of the body covered by the base, wherein one end of the stopper is moveable along the groove rail;
      a first groove formed on one side of the groove rail, the stopper inserted into the first groove when the slide door covers the socket; and
      a second groove formed on the other side of the groove rail, the stopper inserted into the second groove when the slide door opens the socket.

2. The mobile terminal of claim 1, further comprising a case configured to form the appearance of the body, and
   wherein the slot is formed at the case.

3. The mobile terminal of claim 2, wherein the slide door further comprises a manipulation portion protruding from a front surface of the base in a cylindrical shape.

4. The mobile terminal of claim 3, wherein a plurality of concentric patterns concaved as a plurality of circular grooves is formed on a front surface of the manipulation portion.

5. The mobile terminal of claim 4, further comprising a pressing manipulation portion protruding from one surface of the case at a position spaced from the slot,
   wherein the pressing manipulation portion is formed in a cylindrical shape, and a plurality of concentric patterns concaved as a plurality of circular grooves are formed on one surface of the pressing manipulation portion, the surface exposed to the outside.

6. The mobile terminal of claim 5, wherein the manipulation portion is formed to slide the slide door, and
   wherein the pressing manipulation portion is formed to receive a push input such that one of functions preset to the body is executed.

7. The mobile terminal of claim 3, wherein the base further comprises a through hole formed to have a shape corresponding to a protrusion formed on a rear surface of the manipulation portion.

8. The mobile terminal of claim 7, wherein the base and the manipulation portion are integrally formed with each other by welding.

9. The mobile terminal of claim 3, further comprising a supporting portion coupled to a rear surface of the base for preventing deformation of the base when the manipulation portion is pressed.

10. The mobile terminal of claim 1, further comprising a lubricating member formed on one surface of the guide portion contacting the base, and configured to reduce a frictional force between the guide portion and the base.

11. The mobile terminal of claim 10, wherein the lubricating member is formed of a non-conductor such that heat or electricity is prevented from being transferred to the base from the body.

12. The mobile terminal of claim 1, further comprising a display unit concaved or convexed from a front surface of the base such that a type of an external device connected to the socket is displayed.

13. The mobile terminal of claim 1, further comprising a battery case coupled to the body so as to cover a power supply unit mounted to a rear surface of the body, and wherein a concaved portion is formed close to the battery case and the body.

14. The mobile terminal of claim 13, wherein the concaved portion is formed to have a first reflection coefficient with respect to irradiated light, and wherein the battery case and the body each adjacent to the concaved portion and more protruding than the concaved portion, are formed to have a second reflection coefficient higher than the first reflection coefficient.

15. A mobile terminal, comprising:

a case which forms the appearance of a body;

a socket disposed at an inner space of the body, and to which an external device is connected;

a slot penetratingly-formed at the case in correspondence to the socket;

a slide door slidably-coupled to the body so as to expose or cover the socket;

a guide portion formed next to the socket, and provided with a lubricating member on one surface thereof contacting the slide door so as to reduce a frictional force, and coupled to rails of the slide door; and a rail portion formed to be slidable along the guide portion, and coupled to a rear surface of the base so as to be covered by the base, wherein the rail portion comprises:

rails bent from two side ends of the base for enclosing the guide portion; and a stopper formed between the rails and bent from one side of the rail portion toward the guide portion and having an elastically deformed cantilever shape, and wherein the guide portion comprises:

a groove rail recessed from one side of the body covered by the base, wherein one end of the stopper is moveable along the groove rail;

a first groove formed on one side of the groove rail, the stopper inserted into the first groove when the slide door covers the socket; and a second groove formed on the other side of the groove rail, the stopper inserted into the second groove when the slide door opens the socket.

16. The mobile terminal of claim 15, wherein the slide door comprises a base having a plate shape, and wherein the rail portion coupled to a rear surface of the base, and formed to be slidable along the guide portion formed in the body.

17. The mobile terminal of claim 16, wherein the slide door further comprises a manipulation portion protruding from a front surface of the base in a cylindrical shape.

18. The mobile terminal of claim 17, wherein a plurality of concentric patterns concaved as a plurality of circular grooves are formed on a front surface of the manipulation portion.

19. The mobile terminal of claim 17, wherein the base further comprises a through hole formed to have a shape corresponding to a protrusion formed on a rear surface of the manipulation portion.

20. The mobile terminal of claim 15, wherein the lubricating member is formed of a non-conductor such that heat or electricity is prevented from being transferred to the base from the body.

21. The mobile terminal of claim 16, further comprising a display unit concaved or convexed from a front surface of the base such that a type of an external device connected to the socket is displayed.

* * * * *